US009270238B2

(12) United States Patent
Lee et al.

(10) Patent No.: US 9,270,238 B2
(45) Date of Patent: Feb. 23, 2016

(54) DIGITAL CONDENSER MICROPHONE HAVING PREAMPLIFIER WITH VARIABLE INPUT IMPEDANCE AND METHOD OF CONTROLLING VARIABLE INPUT IMPEDANCE OF PREAMPLIFIER

(75) Inventors: Soo-Hyoung Lee, Hwaseung-si (KR); Justin Jungsup Kim, Seongnam-si (KR)

(73) Assignee: CESIGN CO., LTD. (KR)

( * ) Notice: Subject to any disclaimer, the term of this patent is extended or adjusted under 35 U.S.C. 154(b) by 291 days.

(21) Appl. No.: 13/979,938

(22) PCT Filed: May 19, 2011

(86) PCT No.: PCT/KR2011/003720
§ 371 (c)(1),
(2), (4) Date: Jul. 16, 2013

(87) PCT Pub. No.: WO2012/148032
PCT Pub. Date: Nov. 1, 2012

(65) Prior Publication Data
US 2014/0037112 A1     Feb. 6, 2014

(30) Foreign Application Priority Data
Apr. 28, 2011  (KR) .................. 10-2011-0040177

(51) Int. Cl.
| H03F 3/181 | (2006.01) |
| H03F 1/56 | (2006.01) |
| H03F 3/45 | (2006.01) |
| H04R 19/04 | (2006.01) |

(52) U.S. Cl.
CPC .................. *H03F 3/181* (2013.01); *H03F 1/56* (2013.01); *H03F 3/45475* (2013.01); *H04R 19/04* (2013.01)

(58) Field of Classification Search
CPC ........ H04R 19/04; H04R 3/00; H04R 19/016; H04R 3/005; H03F 1/56; H03F 3/45475; H03F 3/181; H03F 1/0272; H03F 3/187; H03F 1/223; H03F 2200/03
USPC ................... 381/95, 111, 113, 120, 174, 191; 330/259–261, 269–271, 282, 290, 86
See application file for complete search history.

(56) References Cited

U.S. PATENT DOCUMENTS 7,612,614 B2 * 11/2009 Li ................................. 330/285
7,702,119 B2    4/2010 Walden
(Continued)

FOREIGN PATENT DOCUMENTS

| JP | 2004336634 | 11/2004 |
| JP | 2010233102 | 10/2010 |
| KR | 1020090058393 | 6/2009 |

OTHER PUBLICATIONS

International Serarch Report—PCT/KR2011/003720 dated Feb. 6, 2012.

Primary Examiner — David Ton
(74) Attorney, Agent, or Firm — Cantor Colburn LLP

(57) ABSTRACT

Provided are a digital condenser microphone having a preamplifier with variable input impedance and a method of controlling the variable input impedance of the preamplifier. The preamplifier includes a bias terminal for applying a bias voltage to an input signal when the input signal is output from a microphone condenser. An impedance unit includes at least one variable input impedance element which is connected to the bias terminal and to which the bias voltage is applied via the bias terminal. An operational amplifier receives the input signal, converts the input signal into an output signal, and outputs the output signal. A control block determines whether a DC voltage level of the output signal output from the operational amplifier has reached a reference value, and controls a total impedance of the impedance unit based on a result of the determination.

11 Claims, 4 Drawing Sheets

(56) References Cited

U.S. PATENT DOCUMENTS

| | | | |
|---|---|---|---|
| 8,335,328 B2 * | 12/2012 | Holzmann | H04R 3/02 381/122 |
| 2006/0008097 A1 | 1/2006 | Stenberg et al. | |
| 2007/0076904 A1 * | 4/2007 | Deruginsky | H03F 1/3211 381/95 |
| 2007/0210864 A1 * | 9/2007 | Hirabayashi | H03G 3/001 330/86 |
| 2009/0285412 A1 * | 11/2009 | Wu | H04R 3/00 381/98 |

* cited by examiner

DIGITAL CONDENSER MICROPHONE HAVING PREAMPLIFIER WITH VARIABLE INPUT IMPEDANCE AND METHOD OF CONTROLLING VARIABLE INPUT IMPEDANCE OF PREAMPLIFIER

TECHNICAL FIELD

The present invention relates, in general, to a digital condenser microphone and, more particularly, to a digital condenser microphone having a preamplifier with variable input impedance and a method of controlling the variable input impedance of the preamplifier.

BACKGROUND ART

Generally, condenser microphones are parts that convert the sound pressure of externally input acoustic signals into a voltage signal. One such condenser microphone is a digital condenser microphone (Electret Condenser Microphone: ECM) which is characterized in that an existing post-processing stage is remarkably simplified and the noise interference of analog signals is eliminated. However, such a digital condenser microphone must be essentially provided with a preamplifier for amplifying input signals and eliminating noise from the input signals because detection sensitivity to externally input acoustic signals is low. In particular, in recent condenser microphones, as condensers are gradually becoming small in size and integrated, active capacitance (typically, about 1 pF to 10 pF) greatly decreases, and then drop in sensitivity is greater.

FIG. 1 is a circuit diagram showing a conventional digital condenser microphone.

Referring to FIG. 1, the conventional digital condenser microphone includes a microphone sensor unit 1, a high-impedance interface unit 2, a Direct Current (DC) cut-off condenser 3, a preamplifier 4, and an Analog to Digital (A/D) converter 5.

The microphone sensor unit 1 includes an input power source $V_s$ and a condenser $C_{mic}$ for a microphone, and is configured to detect an acoustic signal $V_s$ from the outside of the microphone and output the detected acoustic signal as a voltage $V_1$.

The high-impedance interface unit 2 includes a resistor $R_1$ having a high-input impedance at the input terminal of a Junction gate Field-Effect Transistor (JFET). The high-impedance interface unit 2 receives the voltage $V_1$ output from the microphone sensor unit 1 and then outputs a voltage $V_2$ via current control.

The DC voltage cut-off condenser 3 cuts off a DC voltage and only an acoustic signal is converted into current by a resistor $R_2$.

The acoustic signal is converted into the current by the resistors $R_2$ and $R_4$ of the preamplifier 4 and is output as a voltage $V_3$ by resistors $R_3$ and $R_5$ in a subsequent stage, and the voltage $V_3$ is input to the A/D converter 5. In this case, the gain of the preamplifier 4 is determined by $R_3/R_2$ ($R_5/R_4$).

As described above, the conventional preamplifier is configured such that the input voltage $V_1$ undergoes several stages of voltage/current and current/voltage conversion via the impedance interface unit 2 and the input resistors $R_2$ and $R_4$ of the preamplifier 4 and then the amplified voltage signal $V_3$ is output.

However, the conventional digital condenser microphone in which the preamplifier is implemented using the JFET is vulnerable to noise generated by the input power source. Further, disadvantages of the conventional digital condenser microphone are that it requires an individual element, such as the JFET, and that it is inappropriate to integrate the microphone interface, the preamplifier, and the A/D converter into a single chip due to an increase in area attributable to the high-impedance resistor at the input terminal and the DC voltage cut-off condenser.

DISCLOSURE

Technical Problem

Accordingly, the present invention has been made keeping in mind the above problems occurring in the prior art, and an object of the present invention is to provide a digital condenser microphone having a preamplifier with variable input impedance and a method of controlling the variable input impedance of the preamplifier.

Technical Solution

In accordance with an aspect of the present invention, there is provided a preamplifier for a digital condenser microphone, including a bias terminal for applying a bias voltage to an input signal when the input signal is output from a microphone condenser, an impedance unit including at least one variable input impedance element which is connected to the bias terminal and to which the bias voltage is applied via the bias terminal, an operational amplifier for receiving the input signal, converting the input signal into an output signal, and outputting the output signal, and a control block for determining whether a Direct Current (DC) voltage level of the output signal output from the operational amplifier has reached a reference value, and controlling a total impedance of the impedance unit based on a result of the determination.

In accordance with another aspect of the present invention, there is provided a digital condenser microphone including a preamplifier provided with a bias terminal for applying a bias voltage to an input signal when the input signal is output from a microphone condenser, an impedance unit including at least one variable input impedance element which is connected to the bias terminal and to which the bias voltage is applied via the bias terminal, an operational amplifier for receiving the input signal, converting the input signal into an output signal, and outputting the output signal, and a control block for determining whether a Direct Current (DC) voltage level of the output signal output from the operational amplifier has reached a reference value, and controlling a total impedance of the impedance unit based on a result of the determination, a microphone sensor unit provided with the microphone condenser and configured to convert an externally input acoustic signal into the input signal using the microphone condenser and output the input signal to the preamplifier, and an Analog to Digital (A/D) converter configured to receive an output signal from the preamplifier and convert the output signal into a digital signal.

In accordance with a further aspect of the present invention, there is provided a method of controlling a variable input impedance of a preamplifier for a digital condenser microphone, including detecting a Direct Current (DC) voltage level of an output signal output from an operational amplifier, determining whether the DC voltage level has reached a reference value, and if the DC voltage level has not reached the reference value, sequentially one by one turning on switches being in an OFF state, among a plurality of switches respectively corresponding to a plurality of transistors included in an impedance unit.

Advantageous Effects

In accordance with the present invention, there can be provided a digital condenser microphone having a preamplifier with variable input impedance and a method of controlling the variable input impedance of the preamplifier.

In accordance with the present invention, the total impedance of an impedance unit is controlled, so that the DC voltage level of an input signal output from a microphone sensor unit can rapidly converge on an operating region.

Further, after the input signal has converged on the operating region, the total impedance of the impedance unit is increased, thus enabling the DC voltage level and the sensitivity of the input signal to be kept constant.

Furthermore, since the preamplifier of the digital condenser microphone according to the present invention has a compact structure, thermal noise generated by transistors can be reduced. Furthermore, since the preamplifier uses a correction circuit having a feedback structure for adjusting the voltage level of the input signal using the voltage level of the output signal, the start-up time caused by the input impedance can be shortened.

BEST MODE

The present invention may make various changes and have various forms, and specific embodiments will be illustrated in drawings and will be described in detail in the present specification. However, these are not intended to limit the present invention to specific disclosure forms, and it should be understood that the present invention includes all changes, equivalents, or substitutions falling within the spirit and scope of the present invention.

The terms such as "first" and "second" may be used to describe various components, but those components should not be limited by the terms. The terms are merely used to distinguish one component from other components, and a first component may be designated as a second component and a second component may be designated as a first component in a similar manner, without departing from the scope of the present invention.

The terms used in the present specification are merely used to describe specific embodiments and are not intended to limit the present invention. A singular expression includes a plural expression unless a description to the contrary is specifically made in context. In the present specification, it should be understood that such terms as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains.

The terms identical to those defined in generally used dictionaries should be interpreted as having meanings identical to contextual meanings of the related art, and are not interpreted as being ideal or excessively formal meanings unless they are definitely defined in the present specification.

Hereinafter, preferred embodiments of the present invention will be described in detail with reference to the attached drawings.

Figure 1:
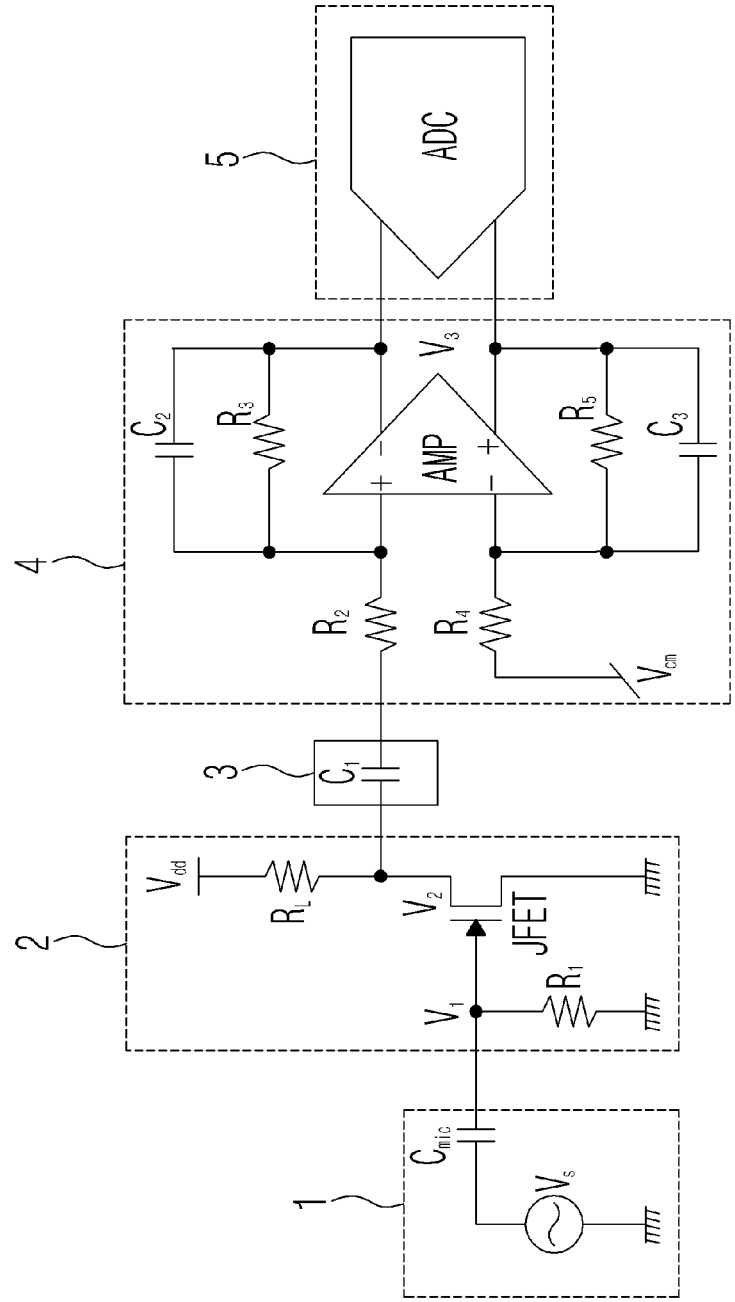
FIG. 1 is a circuit diagram showing a conventional digital condenser microphone.
Figure 2:
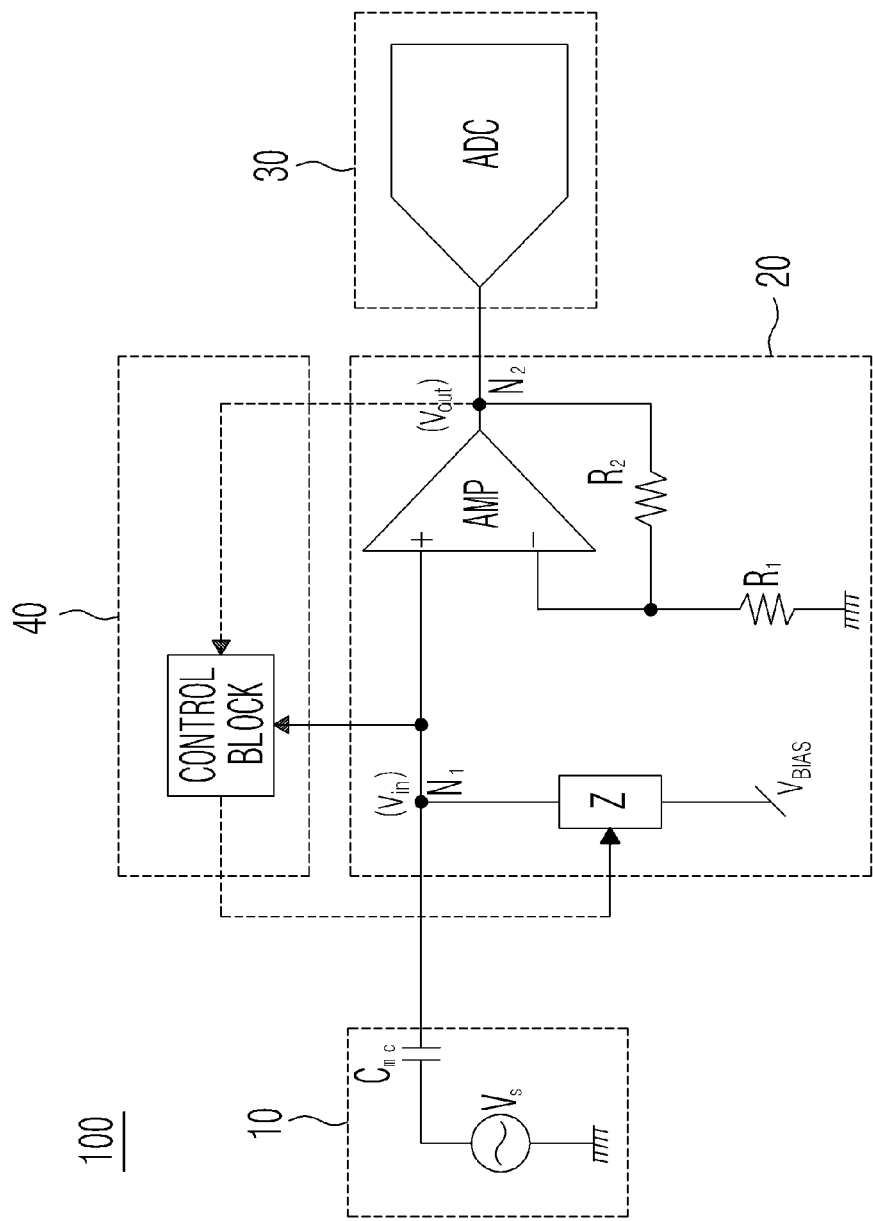
FIG. 2 is a diagram showing the schematic construction of a digital condenser microphone according to an embodiment of the present invention.

FIG. 2 is a diagram showing the schematic construction of a digital condenser microphone according to an embodiment of the present invention.

Referring to FIG. 2, a digital condenser microphone 100 includes a microphone sensor unit 10, a preamplifier 20, an Analog to Digital Converter (A/D converter) 30, and a control block 40.

The microphone sensor unit 10 includes an external signal $V_s$ and a condenser $C_{mic}$ for a microphone (hereinafter referred to as a "microphone condenser $C_{mic}$"). The external signal $V_s$ may be an externally input signal, that is, an audio signal or an acoustic signal that can be collected and combined from the outside of the digital condenser microphone 100. The external signal $V_s$ refers to an electrical signal caused by vibrations that occur due to an audio signal or an acoustic signal when the audio signal or the acoustic signal is received using the digital condenser microphone 100.

When the external signal $V_s$ is applied to the microphone condenser $C_{mic}$, the capacitance of the microphone condenser $C_{mic}$ changes according to the sound pressure of the external signal $V_s$. An input signal $V_{in}$ is a signal generated while the capacitance of the microphone condenser $C_{mic}$ changes according to the sound pressure of the external signal $V_s$.

According to an embodiment, the microphone sensor unit 10 may be a sensor implemented as an individual element using an electret, or may be implemented as a condenser-type silicon Micro Electro Mechanical System (MEMS) microphone integrated into a semiconductor substrate.

The preamplifier 20 includes an impedance unit Z, a bias terminal Bias, and an operational amplifier Amp.

The impedance unit Z is a high-impedance element, and a bias voltage $V_{BIAS}$ is applied to the impedance unit Z via the bias terminal Bias. The impedance unit Z is at least one variable input impedance element, and the total impedance of the impedance unit Z is controlled by the control block 40. In an embodiment, the impedance unit Z may be a variable input impedance element which is an active element.

The bias terminal Bias applies the bias voltage $V_{BIAS}$ that is a DC voltage to the input signal $V_{in}$ that is input to the operational amplifier Amp. The input signal $V_{in}$ is a voltage output from the microphone sensor unit 10 and is detected at a first node $N_1$. The input signal $V_{in}$ is input to the operational amplifier Amp and is converted into current by a resistor $R_1$. The current is output as an output signal $V_{out}$ by a resistor $R_2$ in a subsequent stage, and the output signal $V_{out}$ is input to the A/D converter 30. In this case, the gain of the operational amplifier Amp may be determined by $1+(R_2/R_1)$.

The operational amplifier Amp may be implemented in a mixed form of a folded-cascode structure and a two-stage structure so as to increase the gain. Further, according to an embodiment, the operational amplifier Amp may be implemented in a single output structure in which a common-mode feedback circuit is omitted in order to reduce the number of transistors included in the operational amplifier Amp.

The A/D converter 30 may be implemented as a delta-sigma modulator. Further, the delta-sigma modulator may be implemented as a switched capacitor or a continuous-time structure.

The control block 40 controls the total impedance of the impedance unit Z. In the early stage of operation of the digital condenser microphone 100, the control block 40 activates the bias terminal Bias within a short period of time by decreasing the total impedance of the impedance unit Z, thus enabling the bias voltage $V_{BIAS}$ to be applied to the input signal $V_{in}$. Further, if the bias terminal Bias has already been activated, the control block 40 maintains the bias voltage $V_{BIAS}$ applied to the input signal $V_{in}$ by increasing the total impedance of the impedance unit Z. Accordingly, the input signal $V_{in}$ that is input to the operational amplifier Amp may be transferred unchanged to the A/D converter 30.

In the present embodiment, the preamplifier 20 and the control block 40 are described as being separately implemented, but, in other embodiments, the control block 40 may be included in the preamplifier 20.

Figure 3:
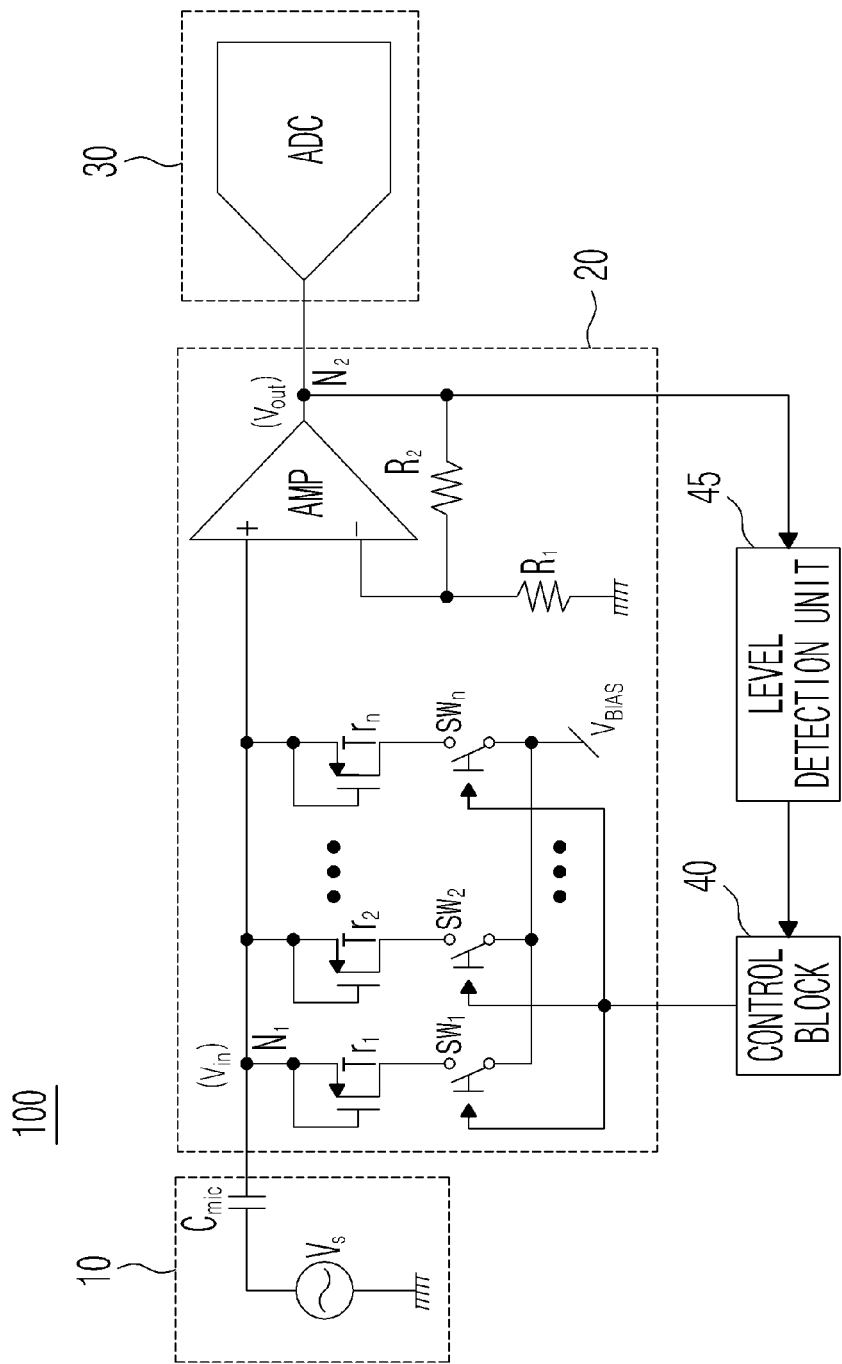
FIG. 3 is a diagram showing in detail the impedance of the digital condenser microphone of FIG. 2.

FIG. 3 is a diagram showing in detail the impedance unit of the digital condenser microphone of FIG. 2.

The impedance unit Z of the digital condenser microphone 100 may include a plurality of transistors $Tr_1, Tr_2, \ldots, Tr_n$ and a plurality of switches $SW_1, SW_2, \ldots, SW_n$ connected in a one-to-one correspondence with the transistors $Tr_1, Tr_2, \ldots, Tr_n$. In this case, the transistors $Tr_1$ to $Tr_n$ and the switches $SW_1$ to $SW_n$ are connected in series with each other. For example, the first transistor $Tr_1$ and the first switch $SW_1$ are connected in series with each other, and the second transistor $Tr_2$ and the second switch $SW_2$ are connected in series with each other.

Further, the transistors $Tr_1$ to $Tr_n$ are connected in parallel with one another. The switches $SW_1$ to $SW_n$ are also connected in parallel with one another, similarly to the transistors $Tr_1$ to $Tr_n$. For example, the first transistor $Tr_1$ and the first switch $SW_1$ are connected in series, but the first and second transistors $Tr_1$ and $Tr_2$ are connected in parallel and the first and second switches $SW_1$ and $SW_2$ are connected in parallel.

In the present embodiment, the transistors $Tr_1$ to $Tr_n$ and the switches $SW_1$ to $SW_n$ respectively corresponding to the transistors $Tr_1$ to $Tr_n$ function as a variable resistor. As shown in FIG. 2, the impedance unit Z is connected in series with the bias terminal Bias and the bias voltage $V_{BIAS}$ is applied to the impedance unit Z. That is, the bias voltage $V_{BIAS}$ is applied both to the transistors $Tr_1$ to $Tr_n$ and to the switches $SW_1$ to $SW_n$ respectively corresponding thereto. Each of the switches $SW_1$ to $SW_n$ may function to turn on/off a connection between a corresponding one of the transistors $Tr_1$ to $Tr_n$ connected in series with the switches $SW_1$ to $SW_n$ and the bias terminal Bias.

The digital condenser microphone 100 according to the present embodiment decreases the total impedance of the impedance unit Z to activate the microphone sensor unit 10. In the state in which the bias voltage $V_{BIAS}$- is applied via the bias terminal Bias, as the number of switches $SW_1$ to $SW_n$ being in an ON state, among the plurality of switches $SW_1$ to $SW_n$, is larger, the total impedance of the impedance unit Z becomes lower.

When the total impedance of the impedance unit Z becomes lower, the DC voltage level of the input signal $V_{in}$ can rapidly converge on an operating region. That is, the voltage level of the input signal $V_{in}$ transferred from the microphone sensor unit 10 of the digital condenser microphone 100 reaches the bias voltage $V_{BIAS}$, thus enabling the input signal $V_{in}$ to be rapidly and effectively transferred to the A/D converter 30.

After the input signal $V_{in}$ has converged on the operating region, the digital condenser microphone 100 increases the total impedance of the impedance unit Z. In the state in which the bias voltage $V_{BIAS}$ has been applied via the bias terminal Bias, as the number of switches $SW_1$ to $SW_n$ being in an OFF state among the plurality of switches $SW_1$ to $SW_n$ is larger, the total impedance of the impedance unit Z becomes higher, and the impedance unit Z may have a total impedance of several gigaohms.

When the total impedance of the impedance unit Z approximates several gigaohms, current leaked through the impedance unit Z becomes considerably small, so that the DC voltage level of the input signal $V_{in}$ can be kept constant.

As described above, the number of switches being in an ON state, among the plurality of switches $SW_1$ to $SW_n$ included in the impedance unit Z, is inversely proportional to the total impedance of the impedance unit Z. Further, in the present embodiment, the plurality of transistors $Tr_1$ to $Tr_n$ included in the impedance unit Z may be transistors $Tr_1$ to $Tr_n$ having the same characteristics. Similarly, the plurality of switches $SW_1$ to $SW_n$ included in the impedance unit Z may be switches $SW_1$ to $SW_n$ having the same characteristics.

The control block 40 controls the total impedance of the impedance unit Z by controlling the ON/OFF operations of the respective switches $SW_1$ to $SW_n$ included in the impedance unit Z. The control block 40 determines whether to turn on or off the plurality of switches $SW_1$ to $SW_n$ on the basis of the level of the output signal $V_{out}$ output from the operational amplifier Amp.

The digital condenser microphone according to the present embodiment may further include a level detection unit 45 to measure the level of the output signal $V_{out}$ output from the operational amplifier Amp. The level detection unit 45 detects the level of the voltage output from the operational amplifier Amp, that is, the DC voltage level of the output signal $V_{out}$ at a second node $N_2$, and transfers the detected DC voltage level to the control block 40.

The control block 40 may determine the DC voltage level of the input signal $V_{in}$ on the basis of the DC voltage level of the output signal $V_{out}$. In this case, the DC voltage level that is a reference value may be a bias voltage $V_{BIAS}$ at which the input signal $V_{in}$ converges on the operating region. If the DC voltage level of the input signal $V_{in}$ has not reached the reference value $V_{BIAS}$, that is, when the DC voltage level of the input signal $V_{in}$ is less than the reference value $V_{BIAS}$, the control block 4 decreases the total impedance of the impedance unit Z by sequentially turning on the switches $SW_1$ to $SW_n$ of the impedance unit Z one by one. That is, the total impedance of the impedance unit Z gradually decreases by sequentially turning on the switches $SW_1$ to $SW_n$ of the impedance unit Z.

In contrast, when the DC voltage level of the input signal $V_{in}$ reaches the reference value $V_{BIAS}$, that is, when the DC voltage level of the input signal $V_{in}$ is the reference value $V_{BIAS}$, the control block 4 may increase the total impedance of the impedance unit Z by turning off the switches $SW_1$ to $SW_n$ of the impedance unit Z. When the switches $SW_1$ to $SW_n$ of the impedance unit Z are turned off, the input impedance, that is, the total impedance of the impedance unit Z, increases, so that the DC voltage level of the input signal $V_{in}$ may be kept constant.

In an embodiment, when the DC voltage level of the input signal $V_{in}$ is the reference value $V_{BIAS}$, the control block 40 may sequentially turn off the switches $SW_1$ to $SW_n$ of the impedance unit Z one by one.

Although, in the present embodiment, the control block 40 and the level detection unit 45 have been described as being separately implemented, the level detection unit 45 may be included in the control block 40 in other embodiments.

Figure 4:
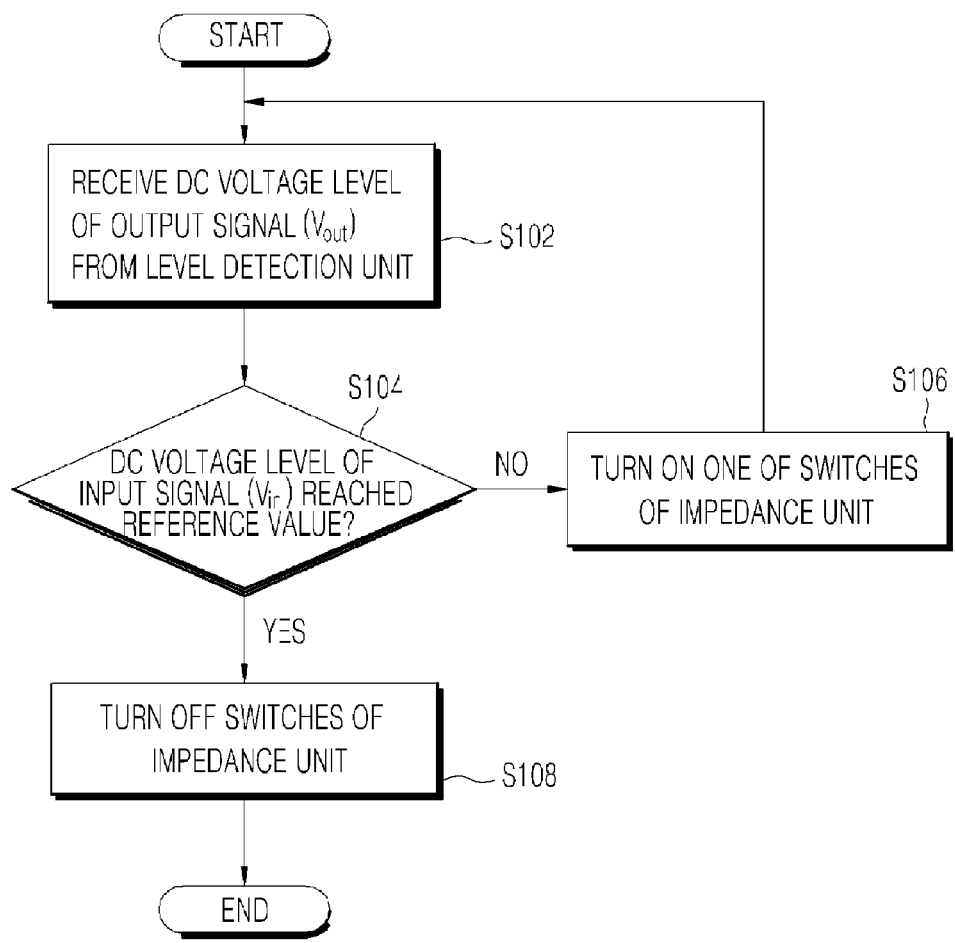
FIG. 4 is a flowchart showing an impedance control method performed by the control block of FIG. 3.

FIG. 4 is a flowchart showing an impedance control method performed by the control block of FIG. 3.

Referring to FIG. 4, the control block 40 receives the DC voltage level of the output signal $V_{out}$ from the level detection unit 45 in step S102. For this operation, the level detection unit 45 may detect the output signal $V_{out}$ output from the operational amplifier Amp and then determine the DC voltage level of the output signal $V_{out}$.

The control block 40 determines whether the DC voltage level of the input signal $V_{in}$ has reached the reference value $V_{BIAS}$, with reference to the DC voltage level of the output signal $V_{out}$, received in step S102, in step S104. According to an embodiment, the reference value $V_{BIAS}$ may be a value previously stored in the control block 40.

The digital condenser microphone 100 according to the present invention functions as a kind of high-pass filter. When the condenser $C_{mic}$ of the microphone sensor unit 10 has a capacitance of, for example, 1 pF to 10 pF, an input resistor having several hundreds of megaohms to several-gigaohms is required so as to process signals ranging from 20 Hz to 20 kHz in an audio frequency band. When the input resistor is implemented, a Metal Oxide Semiconductor (MOS) transistor in a cut-off region or a diode has been used in consideration of the area, noise, etc. In the present embodiment, the bias voltage $V_{BIAS}$ is applied to the input signal $V_{in}$, which has been received from the microphone sensor unit 10 via the first node $N_1$, through the MOS transistor or the diode.

Since the amount of current leaked from a transistor in a cut-off region or a reverse diode is considerably small, it is difficult to measure such a current. Due thereto, it is not easy to form a resistor suitable for the digital condenser microphone 100. Further, the impedance measured at the first node $N_1$ is not constant due to environmental circuit situations, such as a connection to the microphone sensor unit 10, the layout, a Printed Circuit Board (PCB), temperature, and humidity. In this case, when the impedance is excessively high, the time required for the DC voltage level of the input signal $V_{in}$, transferred from the microphone sensor unit 10, to converge on the operating region is lengthened due to an increase in time constant.

The fact that the DC voltage level of the input signal $V_{in}$ has not reached the reference value $V_{BIAS}$ means that the bias voltage $V_{BIAS}$ is not applied to the first node $N_1$, that is, the input signal $V_{in}$, due to the impedance of the impedance unit Z. That is, it means that the total impedance of the impedance unit Z increases, and then the time required for the DC voltage level of the input signal $V_{in}$, output from the microphone sensor unit 10, to converge on the operating region is lengthened.

If it is determined that the DC voltage level has not reached the reference value $V_{BIAS}$ (in the case of "No" in step S104), the control block 40 turns on any one of the switches $SW_1$ to $SW_n$ included in the impedance unit Z in step S106. Until the DC voltage level of the input signal $V_{in}$ reaches the reference value $V_{BIAS}$, the control block 40 repeatedly performs steps S102 to S106. That is, the control block 40 receives the DC voltage level of the output signal $V_{out}$ from the level detection unit 45 in step S102 until the DC voltage level of the input signal $V_{in}$ reaches the reference value $V_{BIAS}$, and determines whether the DC voltage level of the input signal $V_{in}$ has reached the reference value $V_{BIAS}$ in step S104. If it is determined that the DC voltage level has not reached the reference value $V_{BIAS}$, the control block 40 turns on any one switch being in an OFF state among the switches $SW_1$ to $SW_n$ included in the impedance unit Z in step S106.

In contrast, if it is determined that the DC voltage level of the input signal has reached the reference value $V_{BIAS}$ (in the case of "Yes" in step S104), the control block 40 turns off the switches $SW_1$ to $SW_n$ included in the impedance unit Z in step S108. In this way, the switches $SW_1$ to $SW_n$ are turned off, so that the control block 40 increases the total impedance of the impedance unit Z. That is, the control block 40 maintains the DC voltage level of the input signal $V_{in}$ at the reference value $V_{BIAS}$.

Meanwhile, when the operation in step S108 is continuously performed, the total impedance of the impedance unit Z momentarily or continuously increases. When the total impedance of the impedance unit Z momentarily or continuously increases, the DC voltage level may differ from the reference value $V_{BIAS}$. When the DC voltage level differs from the reference value $V_{BIAS}$, the control block 40 may decrease the total impedance by turning on the switches that have been turned off in step S108, either sequentially one by one or simultaneously.

INDUSTRIAL APPLICABILITY

A digital condenser microphone having a preamplifier with variable input impedance and a method of controlling the variable input impedance of the preamplifier according to the present invention may be effectively used in the field of digital microphones.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the above descriptions and the attached drawings should be interpreted as exemplifying the present invention rather than limiting the spirit of the present invention.

The invention claimed is:

1. A preamplifier for a digital condenser microphone, comprising:
    a bias terminal for applying a bias voltage to an input signal when the input signal is output from a microphone condenser;
    an impedance unit connected to the bias terminal and to which the bias voltage is applied via the bias terminal; and
    an operational amplifier for receiving the input signal, converting the input signal into an output signal, and outputting the output signal;
    wherein the impedance unit comprises a plurality of transistors and a plurality of switches corresponding to the transistors and the total impedance of the impedance unit is adjusted by controlling ON/OFF operations of the plurality of switches based on a result of whether the detected directed current (DC) voltage level of the output signal from the operational amplifier has reached a reference value.

2. The preamplifier according to claim 1, wherein the total impedance of the impedance unit is adjusted by gradually decreasing the total impedance of the impedance unit until the DC voltage level of the output signal reaches the reference value.

3. The preamplifier according to claim 1, wherein the total impedance of the impedance unit is adjusted by maintaining or increasing the total impedance of the impedance unit if the DC voltage level of the output signal has reached the reference value.

4. The preamplifier according to claim 1, wherein:
the switches are connected in series with the corresponding transistors, respectively, and
the transistors are connected in parallel with one another and the switches are connected in parallel with one another.

5. A digital condenser microphone comprising:
a bias terminal for applying a bias voltage to an input signal when the input signal is output from a microphone condenser;
an impedance unit connected to the bias terminal and to which the bias voltage is applied via the bias terminal;
an operational amplifier for receiving the input signal, converting the input signal into an output signal, and outputting the output signal; and
an Analog to Digital (A/D) converter for receiving an output signal from the preamplifier and converting the output signal into a digital signal;
wherein the impedance unit comprises a plurality of transistors and a plurality of switches corresponding to the transistors and the total impedance of the impedance unit is adjusted by controlling ON/OFF operations of the plurality of switches based on a result of whether the detected directed current (DC) voltage level of the output signal from the operational amplifier has reached a reference value.

6. The digital condenser microphone according to claim 5, wherein the total impedance of the impedance unit is adjusted by gradually decreasing the total impedance of the impedance unit until the DC voltage level of the output signal reaches the reference value.

7. The digital condenser microphone according to claim 5, wherein the total impedance of the impedance unit is adjusted by maintaining or increasing the total impedance of the impedance unit if the DC voltage level of the output signal has reached the reference value.

8. The digital condenser microphone according to claim 5, wherein:
the switches are connected in series with the corresponding transistors, respectively, and
the transistors are connected in parallel with one another and the switches are connected in parallel with one another.

9. A method of controlling a variable input impedance of a preamplifier for a digital condenser microphone, wherein the preamplifier comprising an impedance unit and an operational amplifier, the method comprising:
applying a bias voltage to an input signal of the preamplifier when the input signal is output from a microphone condenser;
detecting a Direct Current (DC) voltage level of an output signal output from the operational amplifier;
determining whether the DC voltage level has reached a reference value; and if the DC voltage level has not reached the reference value, sequentially one by one turning on switches that have been turned off, among a plurality of switches respectively corresponding to a plurality of transistors included in the impedance unit.

10. The method according to claim 9, further comprising, if the DC voltage level has reached the reference value, turning off the plurality of switches respectively corresponding to the plurality of transistors included in the impedance unit, either sequentially one by one or simultaneously.

11. The method according to claim 10, further comprising, if a comparison between the DC voltage level and the reference value reveals that the DC voltage level has become different from the reference value, turning on the switches that have been turned off, either sequentially one by one or simultaneously.

\* \* \* \* \*